US007573725B2

(12) United States Patent
Nicolaisen

(10) Patent No.: US 7,573,725 B2
(45) Date of Patent: Aug. 11, 2009

(54) OPTIMIZING POWER DELIVERY AND SIGNAL ROUTING IN PRINTED CIRCUIT BOARD DESIGN

(75) Inventor: Joseph R. Nicolaisen, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 235 days.

(21) Appl. No.: 11/620,925

(22) Filed: Jan. 8, 2007

(65) Prior Publication Data
US 2007/0108335 A1 May 17, 2007

Related U.S. Application Data

(62) Division of application No. 10/727,362, filed on Dec. 4, 2003, now Pat. No. 7,161,088.

(51) Int. Cl.
H05K 1/11 (2006.01)
H05K 1/14 (2006.01)
(52) U.S. Cl. .................. 361/794; 361/792; 361/795; 174/256; 174/258; 174/260
(58) Field of Classification Search ......... 174/258–260; 361/794–795
See application file for complete search history.

(56) References Cited

U.S. PATENT DOCUMENTS

| 5,095,407 | A | 3/1992 | Kanezawa et al. ......... 361/794 |
| 5,206,074 | A | 4/1993 | Davis et al. .................. 428/209 |
| 5,354,599 | A | 10/1994 | McClanahan et al. ....... 428/209 |
| 5,418,690 | A | 5/1995 | Conn et al. .................. 361/794 |
| 5,926,377 | A | 7/1999 | Nakao et al. ................. 361/763 |
| 6,215,372 | B1 | 4/2001 | Novak ........................... 333/12 |
| 6,274,224 | B1 | 8/2001 | O'Bryan et al. ............. 428/209 |
| 6,480,396 | B2 | 11/2002 | Ninomiya .................... 361/780 |
| 6,504,111 | B2* | 1/2003 | Curcio et al. ............... 174/264 |
| 6,541,711 | B1 | 4/2003 | Dube et al. .................. 174/261 |
| 6,707,685 | B2 | 3/2004 | Kabumoto et al. ........... 361/794 |
| 2004/0099364 | A1 | 5/2004 | Suzuki et al. ............. 156/89.11 |
| 2004/0118600 | A1 | 6/2004 | Lee et al. .................... 174/260 |

* cited by examiner

Primary Examiner—Tuan T Dinh
(74) Attorney, Agent, or Firm—Baker Botts L.L.P.

(57) ABSTRACT

A system, method and apparatus for providing a printed circuit board having optimized power delivery planes and signal routing regions are disclosed. In one aspect, the present disclosure teaches a printed circuit board having two or more cores coupled together using a prepreg sheet having selected regions of increased permittivity. In combining the cores with the prepreg sheet, the regions of increased permittivity are preferably aligned with power delivery planes defined between respective cores. By increasing the permittivity within the power delivery planes, the greater the reduction in area of the cores needed for power delivery and the greater the area retained on the cores for providing signal routing. As a result, a printed circuit board incorporating teachings of the present disclosure may support more advanced and complex information handling system implementations.

11 Claims, 3 Drawing Sheets

OPTIMIZING POWER DELIVERY AND SIGNAL ROUTING IN PRINTED CIRCUIT BOARD DESIGN

RELATED APPLICATION

This application is a divisional of and claims priority from U.S. patent application Ser. No. 10/727,362 filed Dec. 4, 2003, now U.S. Pat. No. 7,161,088 the contents of which is hereby incorporated by reference in its entirety.

TECHNICAL FIELD

The present disclosure relates generally to information handling systems and, more particularly, to optimizing power delivery and signal routing in information handling system printed circuit boards.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the performance requirements of information handling systems continue to increase, costs associated with printed circuit board (PCB) fabrication also increase. One reason for this increase in costs can be attributed to an increase in PCB complexity. As more signals are added to PCB designs, additional PCB layers are typically required to route those signals and deliver sufficient power to support their functionality. Some high performance system designs have resorted to routing signals on layers that are typically devoted to delivering power. The resulting reduction in available area on these power layers generally yields diminished power delivery performance which, under electrically stressful conditions, may compromise functionality of the entire system. In addition, validating the PCB power delivery, typically a time consuming process, is made considerably more difficult with marginal power delivery designs. As a result, if signal routing must be included on the power delivery layers of a PCB, novel approaches must be devised to mitigate the detrimental effect such routing typically has on power delivery performance.

SUMMARY

In accordance with teachings of the present disclosure, an information handling system for optimizing power delivery and signal routing on printed circuit board power planes is provided. The information handling system preferably includes a printed circuit board having first and second cores, at least one processor and a memory operably coupled to the processor and the printed circuit board. The printed circuit board preferably further includes a dielectric including glass particles disposed in a portion thereof, where the dielectric is operable to couple the first and second cores substantially parallel one another.

In addition, a printed circuit board for optimizing power delivery and signal routing is also provided. The printed circuit board preferably includes a first core, a second core and an insulating material having regions of increased permittivity. The insulating material is preferably operable to couple the first core to the second core where the regions of increased permittivity are disposed proximate at least one power plane defined between the first and second cores.

Further, a method for manufacturing an optimized power delivery and signal routing printed circuit board is provided. The printed circuit board preferably includes a first and a second core. The method for manufacturing the printed circuit board preferably includes integrating an insulating material having a first permittivity into at least a portion of a dielectric layer having a second permittivity. The method preferably also includes coupling the first and second cores together about the dielectric layer such that the insulating material integrated portions substantially align with a power delivery plane defined by at least a portion of the first and second cores.

In one aspect, teachings of the present disclosure provide the technical advantage of permitting regions of a printed circuit board to be optimized for power and signal routing.

In another aspect, teachings of the present disclosure provide the technical advantage of enabling more complex printed circuit board implementations by facilitating an increase in area available for signal routing without compromising effective power delivery.

Further, teachings of the present disclosure provide the technical advantages of a low-cost, efficient alternative to printed circuit board fabrication where regions of the circuit board may be selectively optimized for power delivery and signal routing.

In addition, teachings of the present disclosure provide the technical advantage of enabling variable capacitance power delivery planes, the capacitance of a selected power delivery plane determined by materials, spacing of materials, as well as other factors controlled by a multilayered printed circuit board fabricator.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 6, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
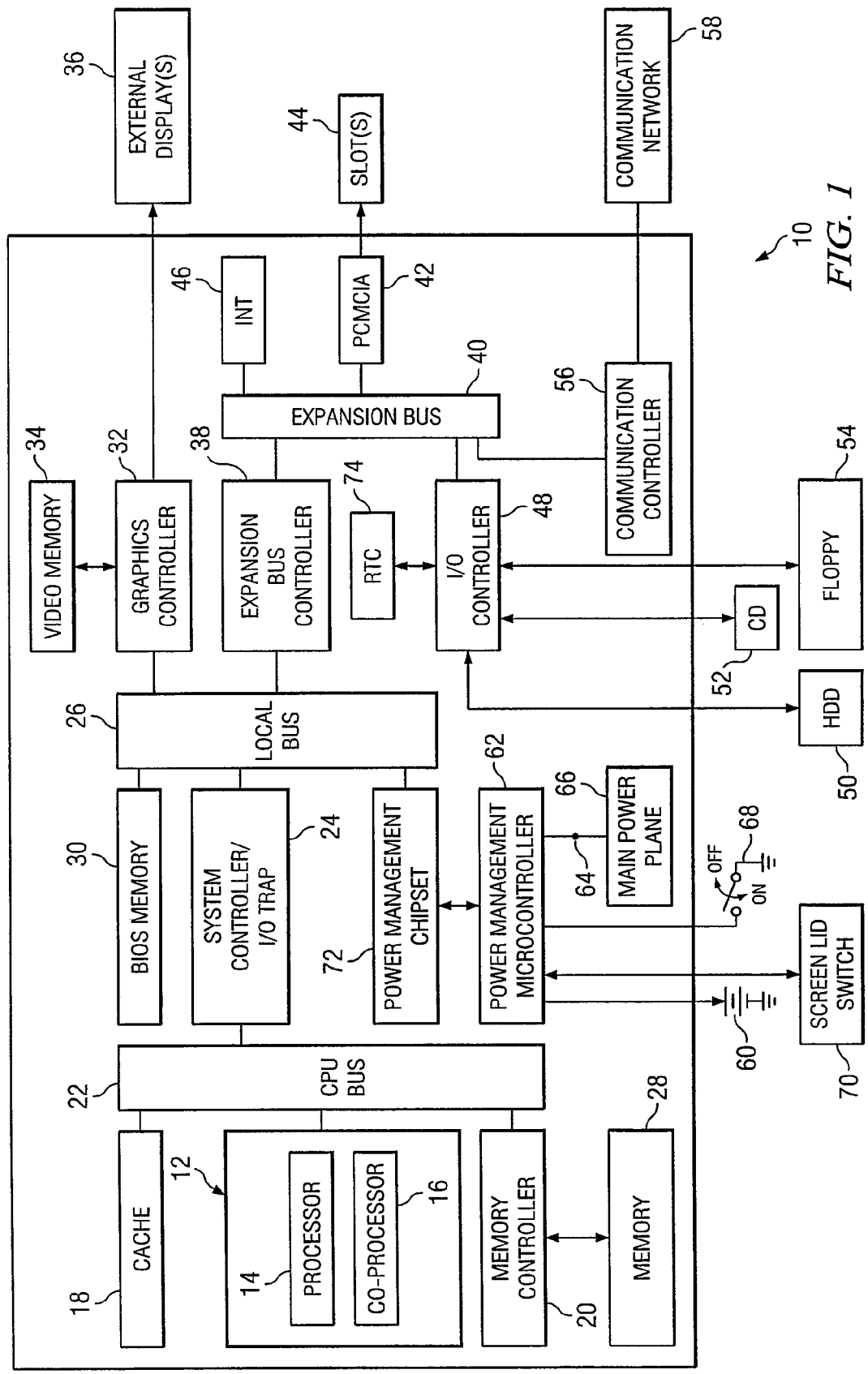
FIG. 1 is a block diagram showing an information handling system including a hybrid printed circuit board power delivery plane, according to teachings of the present disclosure.

Referring first to FIG. 1, a block diagram of an information handling system is shown, according to teachings of the present disclosure. Information handling system or computer system 10 preferably includes at least one microprocessor or central processing unit (CPU) 12. CPU 12 may include processor 14 for handling integer operations and coprocessor 16 for handling floating point operations. CPU 12 is preferably coupled to cache 18 and memory controller 20 via CPU bus 22. System controller I/O trap 24 preferably couples CPU bus 22 to local bus 26 and may be generally characterized as part of a system controller.

Main memory 28 of dynamic random access memory (DRAM) modules is preferably coupled to CPU bus 22 by a memory controller 20. Main memory 28 may be divided into one or more areas such as system management mode (SMM) memory area (not expressly shown).

Basic input/output system (BIOS) memory 30 is also preferably coupled to local bus 26. FLASH memory or other nonvolatile memory may be used as BIOS memory 30. A BIOS program (not expressly shown) is typically stored in BIOS memory 30. The BIOS program preferably includes software which facilitates interaction with and between information handling system 10 devices such as a keyboard (not expressly shown), a mouse (not expressly shown), or one or more I/O devices. BIOS memory 30 may also store system code (note expressly shown) operable to control a plurality of basic information handling system 10 operations.

Graphics controller 32 is preferably coupled to local bus 26 and to video memory 34. Video memory 34 is preferably operable to store information to be displayed on one or more display panels 36. Display panel 36 may be an active matrix or passive matrix liquid crystal display (LCD), a cathode ray tube (CRT) display or other display technology. In selected applications, uses or instances, graphics controller 32 may also be coupled to an integrated display, such as in a portable information handling system implementation.

Bus interface controller or expansion bus controller 38 preferably couples local bus 26 to expansion bus 40. In one embodiment, expansion bus 40 may be configured as an Industry Standard Architecture ("ISA") bus. Other buses, for example, a Peripheral Component Interconnect ("PCI") bus, may also be used.

In a portable information handling system embodiment, Personal Computer Memory Card International Association (PCMCIA) controller 42 may also be included and is preferably coupled to expansion bus 40 as shown. PCMCIA controller 42 is preferably coupled to a plurality of information handling system expansion slots 44. Expansion slots 44 may be configured to receive one or more PCMCIA expansion cards such as modems, fax cards, communications cards, and other input/output (I/O) devices.

Interrupt request generator 46 is also preferably coupled to expansion bus 40. Interrupt request generator 46 is preferably operable to issue an interrupt service request over a predetermined interrupt request line in response to receipt of a request to issue interrupt instruction from CPU 12.

I/O controller 48, often referred to as a super I/O controller, is also preferably coupled to expansion bus 40. I/O controller 48 preferably interfaces to an integrated drive electronics (IDE) hard drive device (HDD) 50, CD-ROM (compact disk-read only memory) drive 52 and/or a floppy disk drive (FDD) 54. Other disk drive devices (not expressly shown) which may be interfaced to the I/O controller include a removable hard drive, a zip drive, a CD-RW (compact disk-read/write) drive, and a CD-DVD (compact disk-digital versatile disk) drive.

Communication controller 56 is preferably provided and enables information handling system 10 to communicate with communication network 58, e.g., an Ethernet network. Communication network 58 may include a local area network (LAN), wide area network (WAN), Internet, Intranet, wireless broadband or the like. Communication controller 56 may be employed to form a network interface for communicating with other information handling systems (not expressly shown) coupled to communication network 58.

As illustrated, information handling system 10 preferably includes power supply 60, which provides power to the many components and/or devices that form information handling system 10. Power supply 60 may be a rechargeable battery, such as a nickel metal hydride ("NiMH") or lithium ion battery, when information handling system 10 is embodied as a portable or notebook computer, an A/C (alternating current) power source, an uninterruptible power supply (UPS) or other power source.

Power supply 60 is preferably coupled to power management microcontroller 62. Power management microcontroller 62 preferably controls the distribution of power from power supply 60. More specifically, power management microcontroller 62 preferably includes power output 64 coupled to main power plane 66 which may supply power to CPU 12 as well as other information handling system components. Power management microcontroller 62 may also be coupled to a power plane (not expressly shown) operable to supply power to an integrated panel display (not expressly shown), as well as to additional power delivery planes preferably included in information handling system 10.

Power management microcontroller 62 preferably monitors a charge level of an attached battery or UPS to determine when and when not to charge the battery or UPS. Power management microcontroller 62 is preferably also coupled to main power switch 68, which the user may actuate to turn information handling system 10 on and off. While power management microcontroller 62 powers down one or more portions or components of information handling system 10, e.g., CPU 12, display 36, or HDD 50, etc., when not in use to conserve power, power management microcontroller 62 itself is preferably substantially always coupled to a source of power, preferably power supply 60.

In a portable embodiment, information handling system 10 may also include screen lid switch or indicator 70 which provides an indication of when an integrated display is in an open position and an indication of when the integrated display is in a closed position. It is noted that an integrated panel display may be located in the same location in a lid (not expressly shown) of the computer as is typical for clamshell configurations of portable computers such as laptop or notebook computers. In this manner, the integrated display may form an integral part of the lid of the system, which swings from an open position to permit user interaction to a closed position.

Computer system 10 may also include power management chip set 72. Power management chip set 72 is preferably coupled to CPU 12 via local bus 26 so that power management chip set 72 may receive power management and control commands from CPU 12. Power management chip set 72 is preferably connected to a plurality of individual power planes operable to supply power to respective components of information handling system 10, e.g., HDD 50, FDD 54, etc. In this manner, power management chip set 72 preferably acts under the direction of CPU 12 to control the power supplied to the various power planes and components of a system.

Real-time clock (RTC) 74 may also be coupled to I/O controller 48 and power management chip set 72. Inclusion of RTC 74 permits timed events or alarms to be transmitted to power management chip set 72. Real-time clock 74 may be programmed to generate an alarm signal at a predetermined time as well as to perform other operations.

Figure 2:
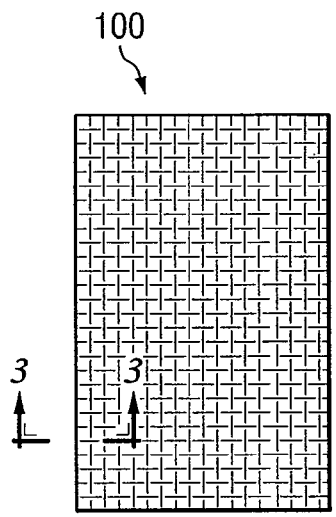
FIG. 2 is a top view showing a woven fiberglass mesh, according to teachings of the present disclosure.
Figure 3:
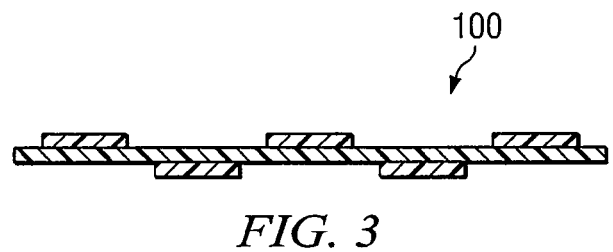
FIG. 3 is a side view of the woven fiberglass mesh of FIG. 2, according to teachings of the present disclosure.

Referring now to FIGS. 2 and 3, a top view and a side view of an exemplary embodiment of a woven fiberglass mesh are shown, respectively. As indicated generally in FIG. 3, fiberglass mesh 100 is preferably a woven fiberglass mesh and typical of an FR4-based prepreg sheet used in the manufacturing of printed circuit boards (PCB). In a preferred embodiment, the woven, fiberglass-based construction of a prepreg sheet results in an effective prepreg sheet dielectric constant based on the dielectric constants of both the selected woven fiberglass mesh and the resin or other adhesive material disposed on one or more sides thereof.

Figure 4:
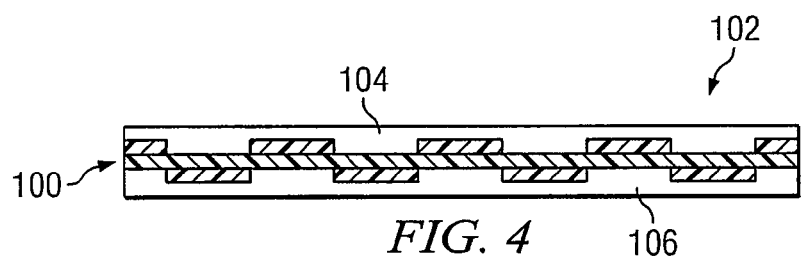
FIG. 4 is a side view of an exemplary embodiment of a prepreg sheet, according to teachings of the present disclosure.

Referring now to FIG. 4, a side view of an exemplary embodiment of a prepreg sheet incorporating woven fiberglass mesh 100 of FIGS. 2 and 3 is shown, according to teachings of the present disclosure. As illustrated, prepreg sheet 102 preferably includes woven fiberglass mesh 100 as well as adhesive layers 104 and 106 on respective sides of woven fiberglass mesh 100. The material chosen for adhesive layers 104 and 106 may be varied, and may include, but is not limited to, one or more types of resin or resin compounds. According to teachings of the present disclosure, prepreg sheet 102 is one example of a dielectric or insulator operable to couple together a plurality of cores to form a multilayered printed circuit board.

As discussed above, prepreg sheet 102 may be constructed from woven fiberglass mesh 102 and adhesive layers 104 and 106. Also as mentioned above, adhesive layers 104 and 106 may be formed from resin or another adhesive material according to teachings of the present disclosure. In one embodiment, adhesive layers 104 and 106 are preferably reprocessed such as by heating the prepreg sheet, such that one or more materials or compounds, such as a material component or compound having an increased or high permittivity, may be integrated, embedded, infused or otherwise incorporated therein. In an alternate embodiment, adhesive layers 104 and 106 preferably include an outer layer or surface subject to reprocessing and operable to receive and adhere one or more layers of one or more components or materials thereon. Alternate embodiments of a PCB hybrid power delivery plane disclosed in teachings of the present disclosure may employ dielectrics of other materials. Examples of dielectric materials include, but are not limited to, polyimide, Teflon, Kevlar, Kapton and Pyralux flexible laminates.

Figure 5:
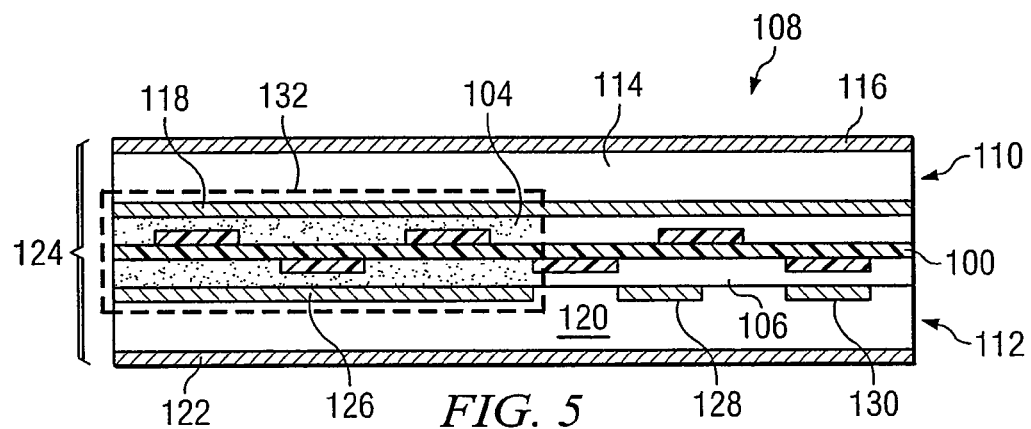
FIG. 5 is a side view showing an exemplary embodiment of a multilayered printed circuit board incorporating a hybrid power delivery plane and at least one signal trace, according to teachings of the present disclosure.

Referring now to FIG. 5, a side view of an exemplary embodiment of a multilayered printed circuit board incorporating teachings of the present disclosure is shown. As illustrated in FIG. 5, multilayered PCB 108 preferably includes cores 110 and 112 coupled to adhesive layers 104 and 106 of prepreg sheet 102, respectively. As shown, core 110 preferably includes insulator or dielectric 114 disposed between copper layers 116 and 118. Similarly, core 112 preferably includes insulator or dielectric 120 disposed between copper layers 122 and 124. In some instances, the combination of prepreg sheet 102 with cores 110 and 112 may be referred to as a panel. Depending on the complexity of PCB to be designed, copper layers 116 and 122 of cores 110 and 112, respectively, may be coupled to one or more additional cores using one or more additional prepreg sheets.

Multilayer printed circuit boards, such as multilayered PCB 108, are often used to implement and support complex information handling system or computer designs. In such implementations, the various copper layers are typically etched, patterned or otherwise subdivided to serve varying purposes throughout the multilayered PCB. Typically, the copper layers of a multilayered printed circuit board are often divided into one or more powered delivery planes as well as into a plurality of signal routing traces. For example, as illustrated in FIG. 5, copper layer 124 is divided into a region defined by power delivery plane section 126 and first and second signal routing traces 128 and 130, respectively. In general, those portions dedicated to power delivery planes are typically employed to distribute power from a power source coupled to the multilayered printed circuit board, such as power source 60 of FIG. 1, to the various components mounted or included thereon. Also in such implementations, the plurality of signal routing traces included in one or more copper layers of a multilayered printed circuit board may be employed to communicate signals generated or received by one or more components between the various components included or integrated thereon.

According to teachings of the present disclosure, power delivery planes and signal routing traces of a multilayered printed circuit board may be optimized such that the availability of signal routing traces may be maximized while the amount of a given copper layer necessary for proper or appropriate power delivery planes may be minimized. A hybrid power delivery plane incorporating teachings of the present disclosure will generally increase power delivery performance while retaining an area for signal routing traces. According to teachings of the present disclosure, power delivery plane performance can be enhanced by increasing the capacitance between adjacent power and ground regions of a multilayered printed circuit board power delivery plane. An exemplary embodiment of a PCB hybrid power delivery plane board is shown generally in FIG. 5.

According to teachings of the present disclosure, a hybrid power delivery plane of multilayered PCB 108 is indicated generally at 132 and may be described as that area between and including copper layer 118 of core 110 and power delivery plane copper layer section 126 of core 112. Prior to infusion, incorporation, mixing, embedding or otherwise implanting higher increased permittivity material 134 substantially within power plane region 132, prepreg sheet 102 possesses a permittivity generally defined by the combination of its respective components, the permittivity of woven fiberglass mesh 100 and the permittivity of adhesive layers 104 and 106 here. As a result of infusing higher or increased permittivity material 134 substantially within power plane 132, the overall permittivity of prepreg sheet 102 may be increased. As a result, with copper layer 118 serving as a ground plane and power delivery plane copper layer section 126 serving as the positive power plane, for example, the capacitance measure within power delivery plane 132 may be increased. As a result of this increased permittivity and corresponding increase in capacitance between the power and ground planes, the power delivery performance of power plane 132 is ultimately enhanced.

A variety of methodologies may be employed, according to teachings of the present disclosure, for increasing the permittivity and corresponding capacitance substantially within a power delivery plane of a multilayered PCB. In one embodiment, adhesive layers 104 and/or 106 may be reprocessed such that a selected amount of increased permittivity material 134, such as glass particles, may be infused, embedded, incorporated, or combined therewith in selected regions. In another embodiment, increased permittivity material 134 may be adhered to a surface of one or more of adhesive layers 104 and 106 substantially within the desired power delivery plane regions prior to coupling prepreg sheet 102 with cores 110 and 112. By selectively increasing the permittivity and capacitance in limited regions of a multilayered PCB, those regions designed for power delivery, such as power delivery plane 132, may be reduced yet optimized while those areas designed for signal routing, such as the region embodying signal routing traces 128 and 130, may be expanded and optimized.

In an embodiment of a multilayered PCB which couples cores 110 to 112 together with a dielectric or insulator other than prepreg sheet 102, such a dielectric or insulator may also have desired regions thereof receive higher increased permittivity material 134. Similar to the methodologies described above, such a dielectric or insulator may be reprocessed, heating for example, such that higher increased permittivity material 134 may be infused or incorporated therein. Such a dielectric or insulator material may also or alternatively be capable of having higher increased permittivity material 134 adhered to one or more exterior surfaces of the dielectric or insulator prior to combination of the dielectric or insulator with cores 110 and 112.

As disclosed herein, a multilayered PCB having a plurality of power delivery planes optimized through varying the capacitance therebetween is contemplated. According to teachings of the present disclosure, the capacitance of a selected power delivery plane may be controlled by, at least, the selection of materials used to form the multilayer and PCB. As such, according to teachings of the present disclosure, a multilayered PCB having a plurality of power delivery planes and where one or more of the power delivery planes possesses a capacitance or permittivity value different from that of the other power delivery planes is contemplated. In one respect, teachings of the present disclosure provide for controlling and varying the capacitance in selected regions of a multilayered printed circuit board through, at least, controlling and varying the spacing between respective cores and copper layers, controlling and varying the materials used to join together cores and the materials selected for increasing the capacitance or permittivity in selected areas or regions of the multilayered PCB design, e.g., one or more power delivery planes.

Figure 6:
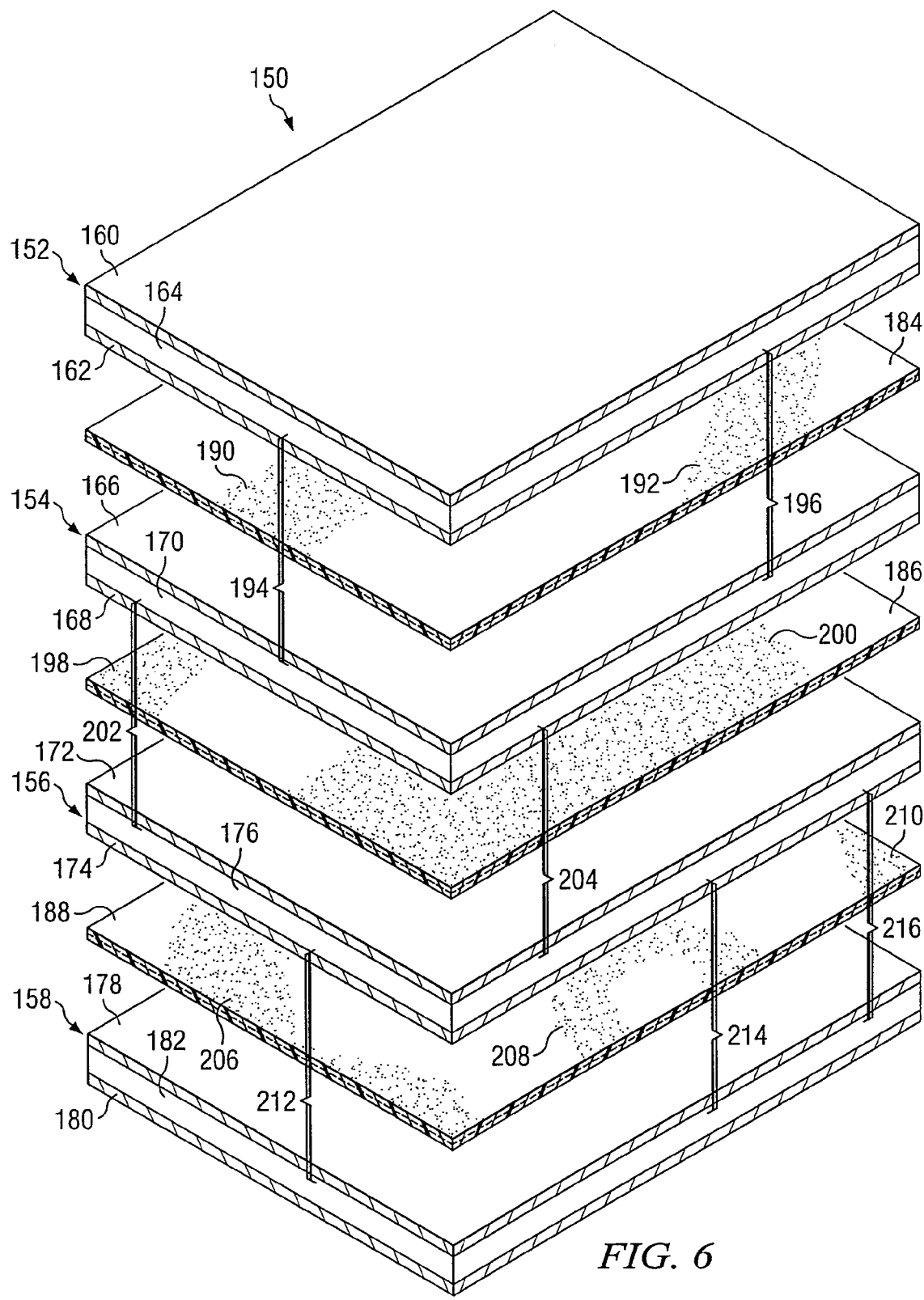
FIG. 6 is an exploded view of an exemplary embodiment of multilayer printed circuit board fabrication, according to teachings of the present disclosure.

Referring now to FIG. 6, an exploded view of an exemplary embodiment of a multilayered printed circuit board incorporating teachings of the present disclosure is shown. As illustrated in FIG. 6, multilayered PCB 150 preferably includes cores 152, 154, 156 and 158. Core 152 preferably includes copper layers 160 and 162 coupled together using insulator or dielectric 164. Core 154 preferably includes copper layers 166 and 168 coupled together using insulator or dielectric 170. Core 156 preferably includes copper layers 172 and 174 coupled together using insulator or dielectric 176. Similarly, core 158 preferably includes copper layers 178 and 180 coupled together using insulator or dielectric 182.

Copper layer 162 of core 152 is preferably coupled to copper layer 166 of core 154 using prepreg sheet 184. Copper layer 168 of core 154 is preferably coupled to copper layer 172 of core 156 using prepreg sheet 186. Similarly, copper layer 174 of core 156 is preferably coupled to copper layer 178 of core 158 using prepreg sheet 188. In one embodiment, preparing sheets 184, 186 and 188 are similar in composition and makeup to prepreg sheet 102 of FIG. 4. In addition, varying embodiments of multilayered PCB 150 may subject one or more of prepreg sheet 184, 186 and 188 to reprocessing such that one or more selected regions thereof may be optimized for power delivery planes and/or signal routings as desired.

As illustrated, multilayered PCB 150 is preferably manufactured as a hybrid power delivery plane printed circuit board. Beginning with prepreg sheet 184, regions 190 and 192, between copper layer 162 of core 152 and copper layer 166 of core 154, are preferably included to create power planes 194 and 196, respectively. Similarly, regions 198 and 200 of prepreg sheet 186 having high or increased permittivity material included therein preferably cooperate with copper layer 168 of core 154 and copper layer 172 of core 156 to create optimized hybrid power delivery planes 202 and 204, respectively. Likewise, regions of increased permittivity 206, 208 and 210 of prepreg sheet 188 preferably cooperate with copper plate 174 of core 156 and copper plate 178 of core 158 to form optimized hybrid power delivery planes 212, 214 and 216, respectively.

It should be noted that detail regarding the numerous signal pathways or signal routing traces component connection points, etc., of multilayered PCB 150 have been omitted from portions of the various FIGURES referenced above to avoid confusion and to focus discussion on concepts of the present disclosure. For example, one or more of the various copper layers of FIG. 6 may typically include complex patterns of copper signal routing traces, power delivery planes, etc., prior to assembly of multilayered PCB 150, such as signal routing traces 128 and 130. Following assembly of a multilayered PCB incorporating teachings of the present disclosure, the multilayered PCB may have one or more vias disposed therein, be subject to more etching, copper deposition, tin sealing, lithographing, etc.

Although the disclosed embodiments have been described in detail, it should be understood that various changes, substitutions and alterations can be made to the embodiments without departing from their spirit and scope.

The invention claimed is:
1. An information handling system, comprising;
   a printed circuit board having:
      first and second cores;

a dielectric operable to couple the first and second cores substantially parallel to one another;

a hybrid power delivery plane between the first and second cores, the hybrid power delivery plane including at least one power delivery region including one or more power delivery elements and at least one signal routing region including one or more signal routing traces; and glass particles disposed in the hybrid power delivery plane proximate the at least one power delivery region such that the permittivity of the hybrid power delivery plane proximate the at least one power delivery region is greater than the permittivity of the hybrid power delivery plane proximate the at least one signal routing region;

at least one processor operably coupled to the printed circuit board; and a memory operably coupled to the processor and the printed circuit board.

2. The information handling system of claim 1, further comprising the dielectric including a fiberglass mesh.

3. The information handling system of claim 1, further comprising portions of the first and second cores defining a printed circuit board power delivery plane.

4. The information handling system of claim 1, wherein the one or more signal routing traces are disposed on one or more of the first and second cores.

5. The information handling system of claim 1, further comprising:
a third core disposed substantially parallel to the first core; and
a second dielectric disposed between the first core and the third core, the second dielectric having at least one region including glass particles disposed between a second power delivery plane defined by the first core and the third core.

6. The information handling system of claim 1, wherein:
the one or more power delivery elements are disposed on one or both of the first and second cores; and
the one or more signal routing traces are disposed on one or both of the first and second cores.

7. The information handling system of claim 1, comprising no glass particles disposed in the hybrid power delivery plane proximate the at least one signal routing region.

8. The information handling system of claim 1, comprising:
a first density or amount of glass particles disposed in the hybrid power delivery plane proximate the at least one power delivery region; and
a second, lower density or amount of glass particles disposed in the hybrid power delivery plane proximate the at least one signal routing region, such that the permittivity of the hybrid power delivery plane proximate the at least one power delivery region is greater than the permittivity of the hybrid power delivery plane proximate the at least one signal routing region.

9. The information handling system of claim 1, wherein:
a fiberglass mesh foundation and an adhesive material disposed on respective sides of the fiberglass mesh foundation; and
the glass particles are disposed in or on the adhesive material.

10. The information handling system of claim 1, wherein the hybrid power delivery plane includes portions of the first and second cores.

11. The information handling system of claim 5, further comprising a fourth core disposed substantially parallel to the second core.

* * * * *